United States Patent
Ishikawa et al.

(10) Patent No.: US 8,013,618 B2
(45) Date of Patent: Sep. 6, 2011

(54) VOLTAGE DETECTION APPARATUS

(75) Inventors: Satoshi Ishikawa, Makinohara (JP); Kimihiro Matsuura, Makinohara (JP); Ryosuke Kawano, Saiki (JP)

(73) Assignee: Yazaki Corporation, Tokyo (JP)

( * ) Notice: Subject to any disclaimer, the term of this patent is extended or adjusted under 35 U.S.C. 154(b) by 231 days.

(21) Appl. No.: 12/505,667

(22) Filed: Jul. 20, 2009

(65) Prior Publication Data
US 2010/0060295 A1    Mar. 11, 2010

(30) Foreign Application Priority Data
Sep. 9, 2008 (JP) .................................. 2008-230633

(51) Int. Cl.
*H01H 31/02* (2006.01)

(52) U.S. Cl. ........ 324/555; 324/430; 324/433; 320/134; 320/136

(58) Field of Classification Search .................. None
See application file for complete search history.

(56) References Cited

U.S. PATENT DOCUMENTS

| 7,531,988 B2 * | 5/2009 | Sato ............................ 320/134 |
| 7,531,990 B2 * | 5/2009 | Morita et al. ................. 320/164 |
| 2006/0273802 A1 | 12/2006 | Murakami et al. |

FOREIGN PATENT DOCUMENTS

JP 2003-243044 A 8/2003

* cited by examiner

*Primary Examiner* — Huy Phan
*Assistant Examiner* — Trung Q Nguyen
(74) *Attorney, Agent, or Firm* — Sughrue Mion, PLLC

(57) ABSTRACT

A voltage detection apparatus includes: a battery including unit cells mutually connected in series; a first block including at least one of the unit cells; a second block including at least one of the unit cells, and provided adjacent to the first block; a first voltage detector connected to the first block, which detects a voltage between both ends of the unit cell in the first block, and which includes: a current source; a current detection element connected to the current source; and a voltage measuring unit which detects a voltage between both ends of the current detection element; and a second voltage detector connected to the second block, which has a similar construction with the first voltage detector. An abnormality detector of the voltage detection apparatus detects an abnormality of the voltage detectors in accordance with the voltages between both ends of the current detection elements.

6 Claims, 2 Drawing Sheets

VOLTAGE DETECTION APPARATUS

BACKGROUND OF THE INVENTION

1. Technical Field

The present invention relates to a voltage detection apparatus, and particularly to a voltage detection apparatus for detecting a voltage of a vehicle-mounted high-voltage battery made of plural unit cells mutually connected in series.

2. Background Art

In recent years, a hybrid vehicle (hereinafter called HEV: Hybrid Electric Vehicle) traveling with a combination of an engine and an electric motor has become widespread. This HEV includes two kinds of batteries of a low-voltage battery of about 12 V for starting of the engine and a high-voltage battery for driving of the electric motor. The high-voltage battery described above obtains a high voltage by using a secondary battery such as a nickel-hydrogen battery or a lithium battery as a unit cell including at least one or more cells or secondary batteries and connecting the plural unit cells in series.

While the high-voltage battery described above repeats charge and discharge, variations occur in a voltage between both ends of each of the secondary batteries, that is, a state of charge (SOC). In the case of charge and discharge of the battery, it is necessary to prohibit charge at a point in time when the secondary battery with the highest SOC (or voltage between both ends) reaches a set upper limit SOC (or upper limit voltage value between both ends) and prohibit discharge at a point in time when the secondary battery with the lowest SOC (or voltage between both ends) reaches a set lower limit SOC (or lower limit voltage value between both ends) from the standpoint of ensuring of safety or durability of each of the secondary batteries. Therefore, when variations in the SOC occur in each of the secondary batteries, a usable capacity of the battery decreases substantially. As a result of this, in the HEV, the so-called assist and regeneration, in which battery energy is replenished with respect to gasoline at the time of ascent or energy is regenerated in the battery at the time of descent, become insufficient and actual vehicle power performance or fuel consumption is reduced. Hence, it is necessary to detect a voltage between both ends of each of the secondary batteries in order to equalize the SOC of each of the secondary batteries.

An apparatus as shown in JP-A-2003-243044 is proposed as a voltage detection apparatus for detecting a voltage between both ends of each of the secondary batteries constructing the high-voltage battery described above. The voltage detection apparatus of JP-A-2003-243044 divides the high-voltage battery into plural modules and detects a voltage between both ends of each of the secondary batteries of the inside of each of the modules by a CPU etc. arranged every module. By being constructed thus, voltages between both ends of plural secondary batteries can be simultaneously detected and also a withstand voltage of a device used for detecting the voltage between both ends can be decreased.

In the voltage detection apparatus described above, a detection error occurs between modules due to variations in accuracy of an A/D converter, a reference voltage, etc. used in detection of a voltage between both ends of each of the modules. When the detection error between the modules is large, an equalization error occurs in the case of equalizing the SOC of each of the secondary batteries, so that each of the secondary batteries could not be used efficiently. When an A/D converter or a reference voltage with high accuracy is used, this error can be eliminated, but there was a problem that the A/D converter or the reference voltage with high accuracy is required by the number of modules divided and a cost increases.

A voltage correction method described in US2006/0273802A is proposed as a method for correcting such an error. In the voltage correction method described in US2006/0273802A, an average value of measured values is calculated every each block and is set as a representative value of the block and its representative value is compared. When there is a difference between the representative values, its difference is corrected.

However, the voltage correction method described in US2006/0273802A had a problem that a difference in voltage is corrected as an error though the voltage detection itself is performed normally when the voltage itself of a block varies.

Also, in order to determine an abnormality of a detected value by the voltage correction method described in US2006/0273802A, it is necessary to add a power source with high accuracy to each of the blocks and this leads to an expensive configuration.

SUMMARY OF THE INVENTION

The invention focuses attention on the problems as described above, and a problem of the invention is to provide a voltage detection apparatus capable of determining an abnormality of voltage detection surely at low cost in the case of detecting a voltage of a block made of unit cells connected in series.

According to an aspect of the invention, there is provided a voltage detection apparatus, including: a battery including a plurality of unit cells mutually connected in series; a first block including at least one of the plurality of unit cells; a second block including at least one of the plurality of unit cells, and provided adjacent to the first block; a first voltage detector connected to the first block, which detects a voltage between both ends of the unit cell in the first block, and which includes: a first current source; a first current detection element connected to the first current source; and a first voltage measuring unit which detects a first voltage between both ends of the first current detection element; a second voltage detector connected to the second block, which detects a voltage between both ends of the unit cell in the second block, and which includes: a second current source; a second current detection element connected to the second current source, and connected to the first current detection element; and a second voltage measuring unit which detects a second voltage between both ends of the second current detection element; and an abnormality detector which detects an abnormality of the first and second voltage detectors in accordance with the first voltage and the second voltage.

In the above voltage detection apparatus, the abnormality detector may judge the first and second voltage detectors as abnormal when the first voltage is different from the second voltage.

In the above voltage detection apparatus, first and second normal voltage between the both ends of first and second current detection elements may be previously set in the abnormality detector, respectively, and the abnormality detector may judge the first and second voltage detectors as abnormal when the first and second voltage are different from the first and second normal voltage, respectively.

In the above voltage detection apparatus, each of the first and second current detection elements may be a resistor element.

In the above voltage detection apparatus, a resistance value of the first current detection element may be equal to a resistance value of the second current detection element.

The above voltage detection apparatus may further include a voltage regulating element provided between the first and second current detection elements.

According to the aspect of the invention, a current source, a current detecting element and a voltage measuring unit for measuring a voltage between both ends of the current detecting element are disposed in a voltage detector. The current detecting elements of the voltage detector corresponding to adjacent blocks are mutually connected and a current is passed from the current source to the current detecting element. Then, an abnormal detector determines an abnormality of the voltage detector from a voltage between both ends of the current detecting element at that time, so that it can determines the abnormality by a state as to whether or not a calculated voltage is different from a measured voltage in the voltage between both ends of the current detecting element when a current flowing from the current source is constant and a resistance value of the current detecting element is previously known, so that the abnormality of the voltage detector can be determined surely at low cost.

Further, the abnormal detector determines that the voltage detector is abnormal when voltages between both ends of current detecting elements mutually connected are different, so that the voltages between both ends of the current detecting elements supposed to match do not match and thereby, an abnormality can be determined surely.

Further, the abnormal detector determines that voltage detector is abnormal when the voltage between both ends of the current detecting element measured by voltage measuring unit is different from the voltage between both ends of the current detecting element at the time of normality, so that an abnormality of the inside of the voltage detector can be determined surely.

Further, a current detecting element is a resistance element, so that the current detecting element can be constructed at low cost.

Further, since resistance values of mutual elements connected mutually become equal, the same current flows from a current source, so that voltages between both ends become the same value, so that an abnormality can be determined surely by detecting a change in this value.

Further, an element for voltage regulation is connected between current detecting elements connected mutually, so that voltages between both ends of the current detecting elements can be made lower than a terminal voltage of a current source.

DETAILED DESCRIPTION OF THE PREFERRED EMBODIMENTS

Figure 1:
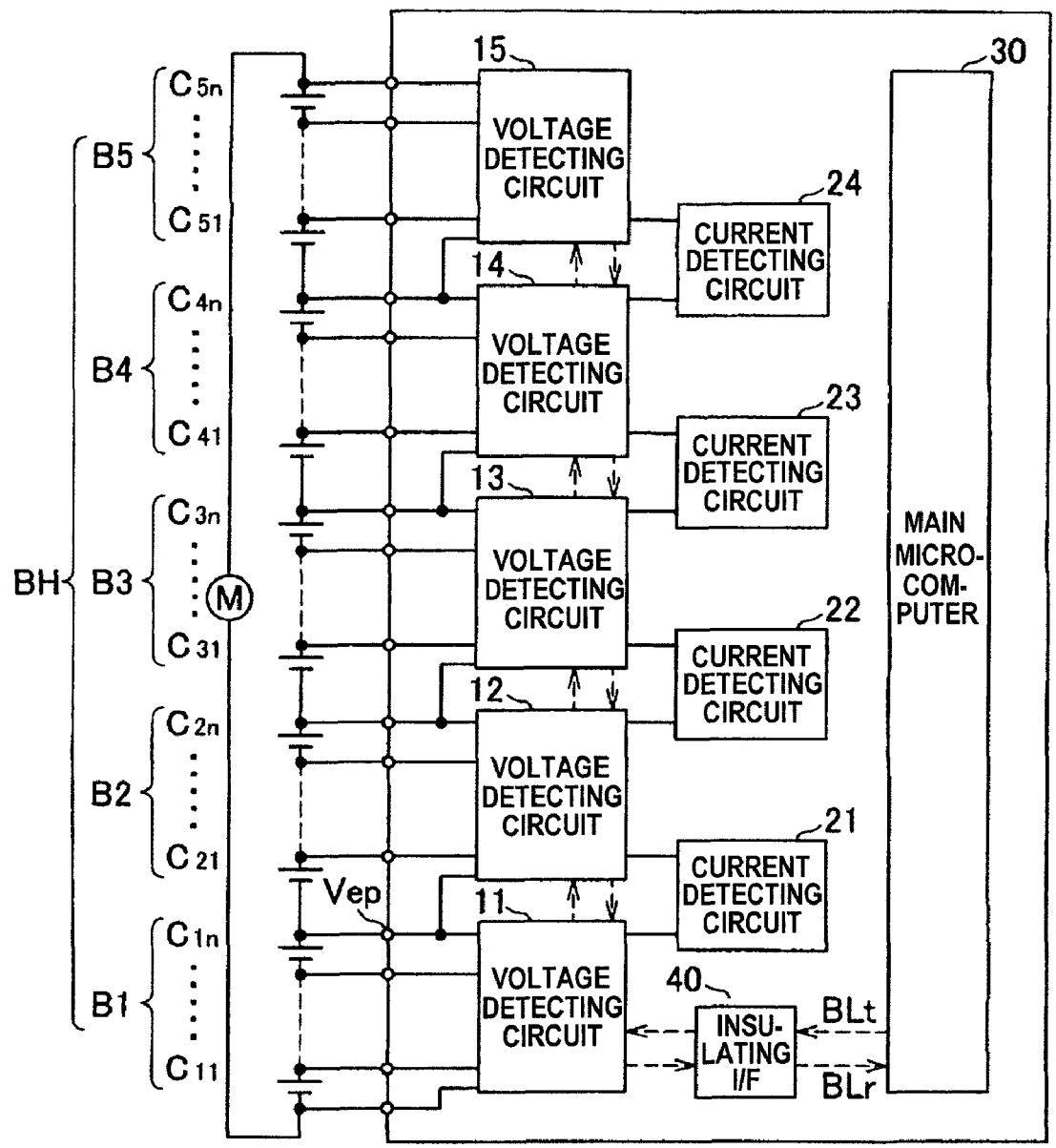
FIG. 1 is a circuit diagram showing a voltage detection apparatus according to an embodiment of the invention.

An embodiment of the invention will hereinafter be described based on the drawings. FIG. 1 is a circuit diagram showing a voltage detection apparatus according to the embodiment of the invention. In FIG. 1, a high-voltage battery BH is provided. The high-voltage battery BH is used as a power source of an electric motor M in an HEV (Hybrid Electric Vehicle) for combining an engine and the electric motor M as a travel driving source, and the electric motor M is connected to both ends of the battery BH as a load as necessary and also an alternator etc. (not shown) are connected as a charger as necessary.

The high-voltage battery BH is divided into plural (five in the present embodiment) blocks B1 to B5. The number of blocks may be varied according to any conditions. The block B1 is constructed of n (n is any integer of 1 or more) unit cells C11 to C1n. The unit cells C11 to C1n are constructed of at least one or more secondary batteries. The other blocks B2 to B5 are similarly constructed of n unit cells.

The voltage detection apparatus includes voltage detecting circuits 11 to 15 as voltage detectors, current detecting circuits 21 to 24, a main microcomputer 30 as an abnormal detector, and an insulating interface 40.

The voltage detecting circuits 11 to 15 are respectively disposed in correspondence with each of the blocks B1 to B5. The voltage detecting circuits 11 to 15 operate by receiving power source supply from the unit cells C11 to C1n constructing the corresponding blocks B1 to B5 among the plural blocks B1 to B5.

The voltage detecting circuits 11 to 15 respectively include a differential amplifier for detecting respective voltages between both ends of each of the unit cells C11 to C1n of the inside of the block and a value of a voltage between both ends of the whole corresponding block, a selective switch group for selectively connecting both ends of the unit cells C11 to C1n constructing each of the blocks B1 to B5 and both ends of each of the blocks B1 to B5 to the differential amplifier, an A/D converter for making digital conversion of a voltage between both ends detected by the differential amplifier, a controller for controlling the selective switch group, etc.

Also, the voltage detecting circuits 11 to 15 include a high-voltage system power source circuit for outputting a constant voltage resulting in an operating power source of the differential amplifier, the A/D converter and the controller from supply voltages of the corresponding blocks B1 to B5, and a breaking switch disposed between the differential amplifier and the A/D converter from the high-voltage system power source circuit. On-off of this breaking switch is controlled by the controller.

Also, the voltage detecting circuits 11 to 15 described above are respectively constructed of one chip. Also, external resistors (not shown) are connected to the voltage detecting circuits 11 to 15. The external resistors correspond to addresses of each of the blocks B1 to B5, and have respectively different resistance values. In the external resistors, the controller respectively reads the resistance values according to power-on from the high-voltage system power source circuit and stores the resistance values in memory (not shown) etc. as addresses of each of the voltage detecting circuits.

The main microcomputer 30 includes a memory and a CPU (not shown). Then, the CPU performs control etc. of the voltage detecting circuits 11 to 1m based on a control program etc. incorporated into the memory.

A bus line BLt for sending and a bus line BLr for receiving are disposed between the voltage detecting circuit 11 and the main microcomputer 30. Also, the insulating interface 40 is disposed on the bus line BLt for sending and the bus line BLr for receiving.

The insulating interface 40 is means for coupling the voltage detecting circuit 11 to the main microcomputer 30 in an electrically insulated state. The main microcomputer 30 and the voltage detecting circuit 11 can send and receive information in a mutually insulated state by the insulating interface 40. Consequently, insulation between the high-voltage battery BH and a low-voltage battery (not shown) for supplying a power source to the main microcomputer 30 can be maintained. As the insulating interface 40, for example, magnetic medium means such as a magnetic coupler or optical medium means such as a photocoupler made of a light emitting element and a light receiving element is publicly known.

Also, daisy chain connection of the voltage detecting circuits 11 to 15 is made in order of the voltage detecting circuits 11, 12, 13, 14, 15. The voltage detecting circuits 11 to 15 transmit its own detection result or a command, etc. from the main microcomputer 30 by communicating between the adjacent voltage detecting circuits.

The current detecting circuits 21 to 24 are disposed so as to make connection between the adjacent voltage detecting circuits. For example, the current detecting circuit 21 is disposed so as to make connection between the voltage detecting circuits 11 and 12. Similarly, the current detecting circuit 22 is disposed so as to make connection between the voltage detecting circuits 12 and 13 and the current detecting circuit 23 is disposed so as to make connection between the voltage detecting circuits 13 and 14 and the current detecting circuit 24 is disposed so as to make connection between the voltage detecting circuits 14 and 15. These have connection different from the daisy chain connection described above as shown in FIG. 1.

Figure 2:
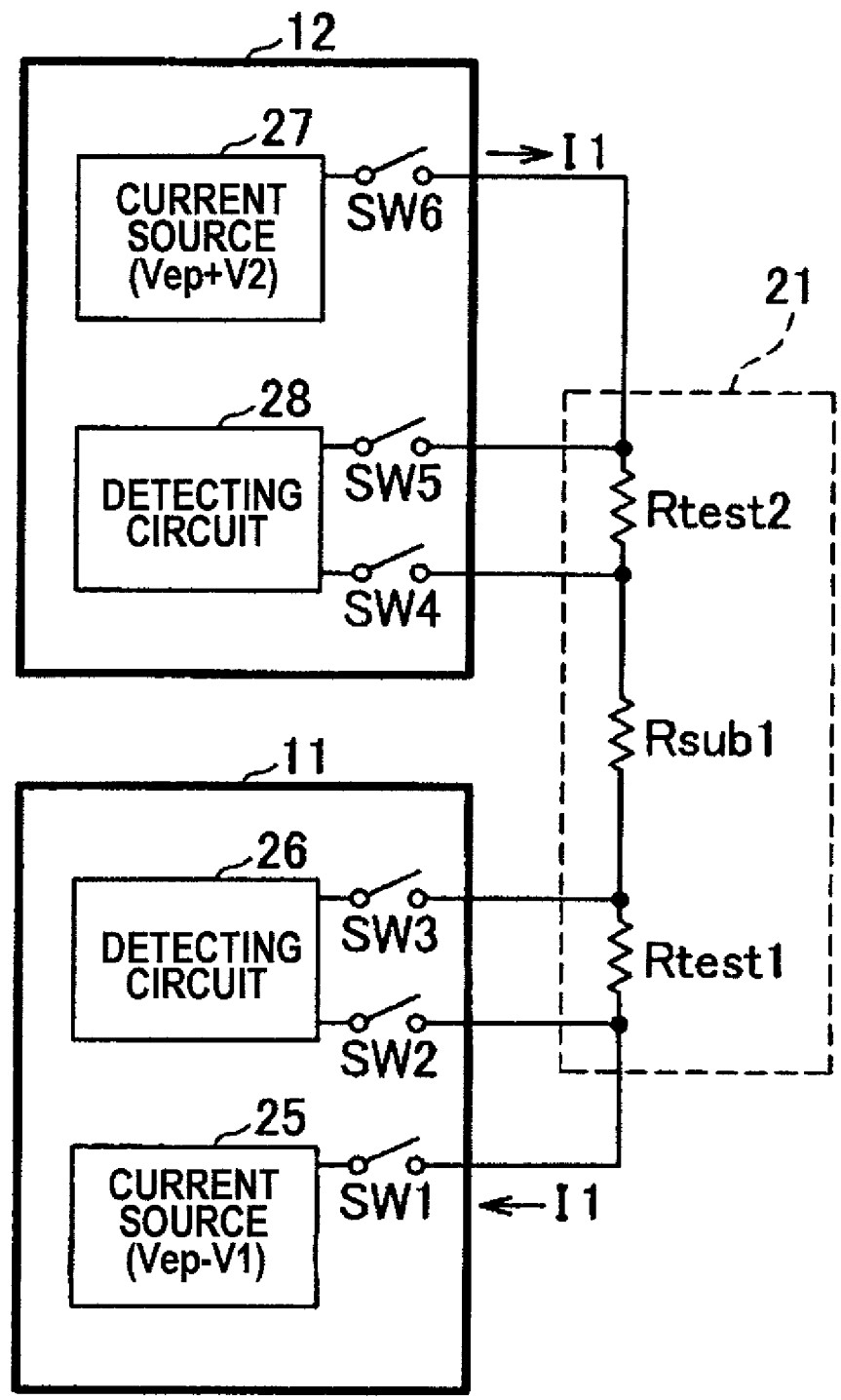
FIG. 2 is a circuit diagram of a current detecting circuit in the voltage detection apparatus shown in FIG. 1.

The current detecting circuit 21 includes a resistor Rtest1 as a (first) current detecting element, a resistor Rtest2 as a (second) current detecting element and a resistor Rsub1 as a voltage regulating element as shown in FIG. 2. The resistor Rsub1 is connected between the resistor Rtest1 and the resistor Rtest2. All of the resistor Rtest1, the resistor Rsub1 and the resistor Rtest2 have the same resistance value. It is necessary that the resistor Rtest1 and the resistor Rtest2 have the same resistance value, but the resistor Rsub1 may have a resistance value different from that of the resistor Rtest1 and the resistor Rtest2. Though description will hereinafter be made in the current detecting circuit 21 and the voltage detecting circuits 11 and 12, the current detecting circuits 22 to 24 and the voltage detecting circuits 13 to 15 have a similar configuration and a similar operation is performed.

A (first) current source 25 and a (first) detecting circuit 26 of the inside of the voltage detecting circuit 11. And a (second) current source 27 and a (second) detecting circuit 28 of the inside of the voltage detecting circuit 12 are respectively connected to the current detecting circuit 21 as shown in FIG. 2.

The current source 25 is a current source for passing a predetermined current through the resistor Rtest1, and is connected to the resistor Rtest1 of the current detecting circuit 21. The current source 25 uses a voltage between both ends of the block B1 as a power source, and generates a voltage of −V1 volt (Vep−V1) based on a potential (Vep) of the upper end of the block B1. The current source 27 is a current source for passing a predetermined current through the resistor Rtest1, and is connected to the resistor Rtest2 of the current detecting circuit 21. The current source 27 uses a voltage between both ends of the block B2 as a power source, and generates a voltage of +V2 volt (Vep+V2) based on a potential (Vep) of the lower end of the block B2.

The detecting circuits 26, 28 as voltage measuring units detect (measure) voltages between both ends of the resistor Rtest1 and the resistor Rtest2, respectively.

Also, a switch SW1 is disposed between the current source 25 and the current detecting circuit 21. Switches SW2, SW3 are disposed between both ends of the resistor Rtest1 of the current detecting circuit 21 and the detecting circuit 26. A switch SW6 is disposed between the current source 27 and the current detecting circuit 21. Switches SW4, SW5 are disposed between both ends of the resistor Rtest2 of the current detecting circuit 21 and the detecting circuit 28, respectively. In these switches, closing control is performed at the time of abnormal detection operation of the voltage detecting circuits 11, 12 using the current detecting circuit 21.

In the embodiment, the detecting circuits 26, 28 detect voltages between both ends of the resistor Rtest1 and the resistor Rtest2 by a flying capacitor method. The flying capacitor method is a well-known method in which, for example, for the detecting circuit 26, closing control of the switches SW2, SW3 is performed and a voltage of the resistor Rtest1 is charged into a capacitor (that is, a flying capacitor) of a state of being floated from a ground incorporated into the detecting circuit 26 and opening control of the switches SW2, SW3 is performed and then a voltage between both ends of the capacitor is detected. By being detected by the flying capacitor method, conversion into a voltage based on a ground potential can be made. Also, in addition to the flying capacitor method, a differential method using an operational amplifier may be adopted.

When a current flowing through the current detecting circuit 21 is set at I1 in the circuit shown in FIG. 2, I1 is obtained by the following formula:

$$I1=((Vep+V2)-(Vep-V1))/(Rtest1+Rsub1+Rtest2) \quad (1)$$

Therefore, voltages to be detected by the detecting circuits 26, 28 are respectively obtained by the following formulas:

$$\text{Voltage to be detected by the detecting circuit } 26 = Rtest1 \times I1 \quad (2)$$

$$\text{Voltage to be detected by the detecting circuit } 28 = Rtest2 \times I1 \quad (3)$$

Here, a current I1 flowing out of the current source 27 is equal to a current I1 flowing into the current source 25 and also the resistor Rtest1 and the resistor Rtest2 have the same resistance value, so that the voltages detected by the detecting circuits 26, 28 become the same voltage.

The main microcomputer 30 compares a voltage value detected by the detecting circuit 26 with a voltage value detected by the detecting circuit 28, and determines that it is abnormal when the voltage values are different voltages from each other. In other words, it is determined that a measured value of a corresponding block or a unit cell measured by the voltage detecting circuit 11 or 12 is not accurate. That is, it is determined that the voltage detecting circuit is abnormal when voltages between both ends of the resistors Rtest1 and Rtest2 mutually connected are different from each other. It can be determined which voltage detecting circuit is abnormal by previously calculating a voltage to be detected by the detecting circuit 26 and a voltage to be detected by the detecting circuit 28 by the formulas (1) to (3) described above and comparing their voltages. That is, it is determined that the voltage detecting circuit is abnormal when voltages between both ends of the resistors Rtest1 and Rtest2 at the time of normality are preset and voltages between both ends of the resistors Rtest1 and Rtest2 measured by the detecting circuits 26, 28 are different from the voltages between both ends of the resistors Rtest1 and Rtest2 at the time of normality. Also, when it is determined that the voltage detecting circuit is abnormal, and if a difference between a measured voltage and a voltage to be essentially measured is small, a correction may be made; while if the difference is large, an abnormal warning may be given, for example.

According to the voltage detection apparatus described above, the current sources 25, 27 and the detecting circuits 26, 28 are disposed in the voltage detecting circuits 11, 12. The resistor Rtest1, the resistor Rtest2 and the resistor Rsub1 with the same resistance value are connected between the current source 25 and the current source 27. And a voltage between both ends of the resistor Rtest1 is detected by the detecting circuit 26 and a voltage between both ends of the resistor Rtest2 is detected by the detecting circuit 28. In this case, when both of detection results are different based on both of the detection results, the main microcomputer 30 determines that it is abnormal, and determines an abnormal voltage detecting circuit by making a comparison with a voltage between both ends calculated previously, so that an abnormality of the voltage detecting circuit can be determined surely.

Also, the resistor Rtest1 and the resistor Rtest2 are used, so that the apparatus can be constructed at low cost.

Also, the resistor Rsub1 is disposed between the resistor Rtest1 and the resistor Rtest2, so that voltages between both ends of the resistor Rtest1 and the resistor Rtest2 can be made lower than terminal voltages (that is, V1 or V2) of the current sources 25, 27.

In addition, in the embodiment described above, the resistor is used as a current detecting element, but as long as the element is an element in which the same voltage is generated at the time when a diode, a transistor, etc. are connected in series and a constant current is passed, the element can be used.

Also, in the embodiment described above, the current detecting circuits are disposed between each of the voltage detecting circuits, alternatively, for example, in the case of FIG. 1, the current detecting circuit 22 or 23 may be omitted. In the case of omitting the current detecting circuit 22, an abnormality of the voltage detecting circuit 12 can be detected by the current detecting circuit 21 and an abnormality of the voltage detecting circuit 13 can be detected by the current detecting circuit 23. Similarly, in the case of omitting the current detecting circuit 23, an abnormality of the voltage detecting circuit 13 can be detected by the current detecting circuit 22 and an abnormality of the voltage detecting circuit 14 can be detected by the current detecting circuit 24.

The embodiment described above only shows a typical form of the invention, and the invention is not limited to the embodiment. That is, the invention can be variously modified and implemented without departing from the gist of the invention.

What is claimed is:

1. A voltage detection apparatus, comprising:
    a battery including a plurality of unit cells mutually connected in series;
    a first block including at least one of the plurality of unit cells;
    a second block including at least one of the plurality of unit cells, and provided adjacent to the first block;
    a first voltage detector connected to the first block, which detects a voltage between both ends of the unit cell in the first block, and which includes: a first current source; a first current detection element connected to the first current source; and a first voltage measuring unit which detects a first voltage between both ends of the first current detection element;
    a second voltage detector connected to the second block, which detects a voltage between both ends of the unit cell in the second block, and which includes: a second current source; a second current detection element connected to the second current source, and connected to the first current detection element; and a second voltage measuring unit which detects a second voltage between both ends of the second current detection element; and
    an abnormality detector which detects an abnormality of the first and second voltage detectors in accordance with the first voltage and the second voltage.

2. The voltage detection apparatus according to claim 1, wherein the abnormality detector judges the first and second voltage detectors as abnormal when the first voltage is different from the second voltage.

3. The voltage detection apparatus according to claim 1, wherein first and second normal voltages between the both ends of first and second current detection elements are previously set in the abnormality detector, respectively, and the abnormality detector judges the first and second voltage detectors as abnormal when the first and second voltages are different from the first and second normal voltages, respectively.

4. The voltage detection apparatus according to claim 1, wherein each of the first and second current detection elements is a resistor element.

5. The voltage detection apparatus according to claim 4, wherein a resistance value of the first current detection element is equal to a resistance value of the second current detection element.

6. The voltage detection apparatus according to claim 1, further comprising a voltage regulating element provided between the first and second current detection elements.

* * * * *